United States Patent
Lin et al.

(10) Patent No.: US 9,653,504 B1
(45) Date of Patent: May 16, 2017

(54) CHIP-SCALE PACKAGED IMAGE SENSOR PACKAGES WITH BLACK MASKING AND ASSOCIATED PACKAGING METHODS

(71) Applicant: OmniVision Technologies, Inc., Santa Clara, CA (US)

(72) Inventors: Wei-Feng Lin, Hsinchu (TW); Chun-Sheng Fan, Hsinchu (TW)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 14/930,912

(22) Filed: Nov. 3, 2015

(51) Int. Cl.
*H01L 27/146* (2006.01)
*H01L 31/18* (2006.01)

(52) U.S. Cl.
CPC .. *H01L 27/14623* (2013.01); *H01L 27/14618* (2013.01); *H01L 27/14625* (2013.01); *H01L 27/14685* (2013.01); *H01L 27/14687* (2013.01)

(58) Field of Classification Search
CPC ......... H01L 27/14623; H01L 27/14618; H01L 27/14685; H01L 27/14625; H01L 27/14627; H01L 27/14687; H01L 27/1462; H01L 2224/93–2224/95001; H04N 5/2257; H04N 5/2254; H04N 5/2253
See application file for complete search history.

(56) References Cited

U.S. PATENT DOCUMENTS

| | | | | |
|---|---|---|---|---|
| 9,293,505 B2* | 3/2016 | Nabighian | ........ | H01L 27/14687 |
| 2006/0180887 A1* | 8/2006 | Ono | ................... | H01L 27/14618 257/432 |
| 2007/0241273 A1* | 10/2007 | Kim | ................... | H01L 27/14625 250/239 |
| 2009/0256260 A1* | 10/2009 | Nakamura | ........ | H01L 27/14618 257/758 |
| 2010/0052192 A1* | 3/2010 | Hasegawa | ............. | H01L 23/552 257/797 |
| 2010/0117175 A1* | 5/2010 | Shizuno | ............ | H01L 27/14618 257/432 |
| 2010/0117176 A1* | 5/2010 | Uekawa | ............ | H01L 27/14618 257/432 |
| 2011/0073975 A1* | 3/2011 | Mukaida | ................. | H01L 23/16 257/432 |
| 2011/0291215 A1* | 12/2011 | Tu | ..................... | H01L 27/14618 257/433 |
| 2011/0298000 A1* | 12/2011 | Liu | ....................... | H01L 23/481 257/99 |

(Continued)

*Primary Examiner* — Marvin Payen
*Assistant Examiner* — Jeremy Joy
(74) *Attorney, Agent, or Firm* — Lathrop & Gage LLP

(57) ABSTRACT

A chip-scale image sensor packaging method with black masking includes (a) cutting a composite wafer having a plurality of image sensors bonded to a common glass substrate to form slots in the common glass substrate, wherein the slots define a cover glass for each of the image sensors, respectively, (b) forming black mask in the slots such that the black mask, for each of the image sensors, spans perimeter of the cover glass as viewed cross-sectionally along optical axis of the image sensors, and (c) dicing through the black mask in the slots to singulate a plurality of chip-scale packaged image sensors each including one of the image sensors and the cover glass bonded thereto, with sides of the cover glass facing away from the optical axis being at least partly covered by the black mask.

11 Claims, 13 Drawing Sheets

(56) References Cited

U.S. PATENT DOCUMENTS

| | | | |
|---|---|---|---|
| 2012/0068292 A1* | 3/2012 | Ikeda | G02B 13/006 257/432 |
| 2012/0273908 A1* | 11/2012 | Kinsman | H01L 27/14618 257/432 |
| 2013/0265459 A1* | 10/2013 | Duparre | H04N 5/23238 348/218.1 |
| 2015/0318325 A1* | 11/2015 | Nabighian | H01L 27/14687 438/73 |

* cited by examiner

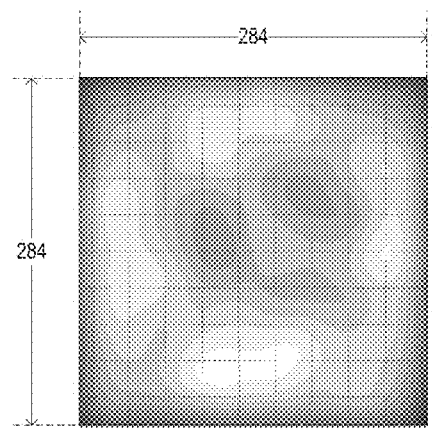
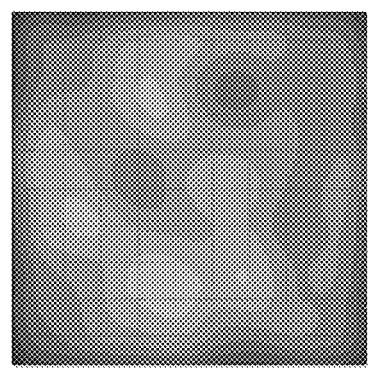
FIG. 4A  FIG. 4B
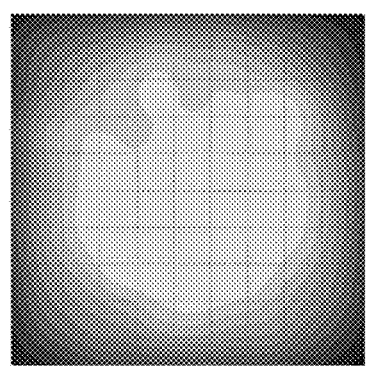
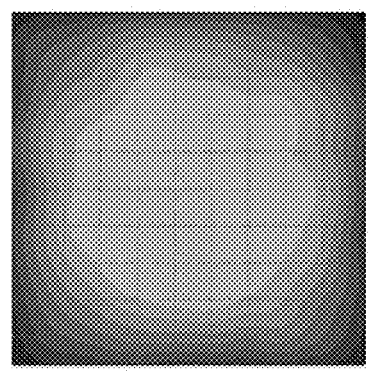
FIG. 4C  FIG. 4D
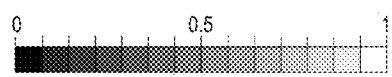
FIG. 4E

CHIP-SCALE PACKAGED IMAGE SENSOR PACKAGES WITH BLACK MASKING AND ASSOCIATED PACKAGING METHODS

BACKGROUND

Cameras are incorporated into a wide range of devices. For example, widely used consumer electronics devices, such as phones, tablets, and laptops, include a camera. To comply with the targeted cost for such devices, the camera must be manufactured at very low cost. The manufacturing cost of a typical camera module is composed of (a) cost of materials, such as cost of the image sensor, the lens material, and the packaging material, and (b) cost of packaging (including assembly). In many cases, the cost of packaging is significant and may even exceed the cost of materials. For example, both image sensors and lenses may be inexpensively produced at the wafer-level, while the process of aligning the lens with the image sensor and the process of constructing a light-tight housing (apart from the viewing port) for the camera module are non-wafer-level processes that contribute to the total cost of a camera module in a non-negligible fashion.

The size of wafer-level image sensors is decreasing steadily. This development is driven, at least in part, by cost. A smaller image sensor reduces the bill of materials per image sensor and also increases the number of image sensors produced per wafer. In addition, associated lenses and packaging may be made smaller, which leads to further cost reduction as well as very compact camera modules compatible with tight spatial constraints such as those associated with cellular phones.

SUMMARY

In an embodiment, a chip-scale image sensor packaging method with black masking includes cutting a composite wafer having a plurality of image sensors bonded to a common glass substrate to form slots in the common glass substrate, wherein the slots define a cover glass for each of the image sensors, respectively. The method also includes forming black mask in the slots such that the black mask, for each of the image sensors, spans the perimeter of the cover glass as viewed cross-sectionally along the optical axis of the image sensors. Furthermore, the method includes dicing through the black mask in the slots to singulate a plurality of chip-scale packaged image sensors. Each of the chip-scale packaged image sensors includes one of the image sensors and the cover glass bonded thereto, wherein sides of the cover glass facing away from the optical axis are at least partly covered by the black mask.

In an embodiment, a chip-scale packaged image sensor includes an image sensor, a cover glass bonded to the image sensor, and a black mask on sides of the cover glass facing away from optical axis of the image sensor.

BRIEF DESCRIPTION OF THE DRAWINGS

FIGS. 4A and 4B show, according to a simulation, images captured by the cover-glass covered image sensors of FIGS. 3A and 3B.

FIGS. 4C and 4D show, according to a simulation, images captured by the CSP image sensors of FIGS. 3C and 3D.

FIG. 4E shows the intensity scale for each of FIGS. 4A-D.

DETAILED DESCRIPTION OF THE EMBODIMENTS

Figure 1:
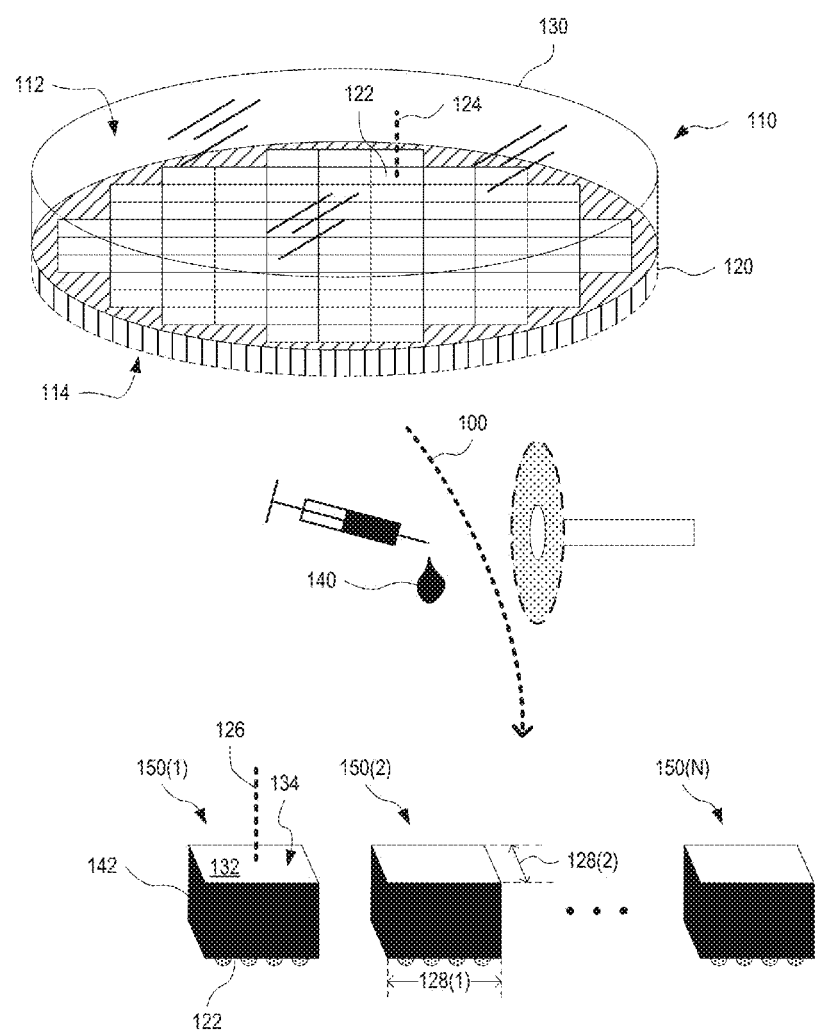
FIG. 1 illustrates a chip-scale image sensor packaging method with integrated black masking for producing a plurality of chip-scale packaged (CSP) image sensors, according to an embodiment, as well as exemplary CSP image sensors produced by the chip-scale image sensor packaging method.

FIG. 1 illustrates one exemplary chip-scale image (CSP) sensor packaging method 100 with integrated black masking for producing a plurality of CSP image sensors with black masking. FIG. 1 also illustrates exemplary CSP image sensors 150 produced by method 100. CSP image sensor 150 includes a black mask 142 that shields the light-detecting element of CSP image sensor 150 from stray light that would enter the sides of CSP image sensor 150 in the absence of black mask 142. This is particularly beneficial for image sensors having small transverse extent, since such image sensors are more susceptible to noise caused by stray light entering the image sensor its sides and also collect less light through the intended light-receiving surface due to the small transverse extent. Herein, "transverse" refers to a dimension orthogonal to the optical axis 126 of an image sensor. CSP image sensor 150 has a transverse extents 128. Transverse extents 128 are orthogonal to the optical axis 126 of CSP image sensor 150. One or both of transverse extents 128 may be as small as approximately one millimeter or less.

Method 100 is a wafer level process that integrates the light-shielding aspect of image sensor packaging. This provides for streamlined manufacturing as compared to conventional packaging methods performed at the individual die level after singulating image sensors from a wafer. Method 100 is thus capable of delivering high yield at low cost. Method 100 processes a composite wafer 110 to produce a plurality of CSP image sensors 150. Composite wafer 110 includes a plurality of image sensors 122 bonded to a common glass substrate 130. For clarity of illustration, not all image sensors 122 are labeled in FIG. 1. Image sensors 122 are produced at the wafer-level in an image sensor wafer 120. Each image sensor 122 is, for example, a complementary-metal-oxide semiconductor (CMOS) image sensor. In one embodiment, method 100 processes a composite wafer 110 including image sensor wafer 120. In another embodiment, material has been removed from image sensor wafer 120, after bonding of image sensor wafer 120 to common glass substrate 130, such that image sensors 122 of composite wafer 110 are bonded to common glass substrate 130 only and not to each other. The processing steps of method 100 include cutting of composite wafer 110 and application of black masking material 140.

CSP image sensor 150, as produced by method 100, includes image sensor 122 and a cover glass 132. Cover glass 132 is a portion of common glass substrate 130. Sides of cover glass 132 facing away from optical axis 126 are at least partly covered by black mask 142 formed from black masking material 140. Black mask 142 is opaque to light in the detection wavelength range of image sensor 122. As a result, light enters CSP image sensor 150 to be detected by image sensor 122 only, or at least predominantly, through the intended light-receiving surface 134 of CSP image sensor 150. Black mask 142 may be a coating with thickness in the range from one micron to 200 microns. For clarity of illustration, image sensor 122, optical axis 126, transverse extents 128, cover glass 132, light-receiving surface 134, and black mask 142 are labeled only for some of CSP image sensors 150 shown in FIG. 1.

Figure 2A:
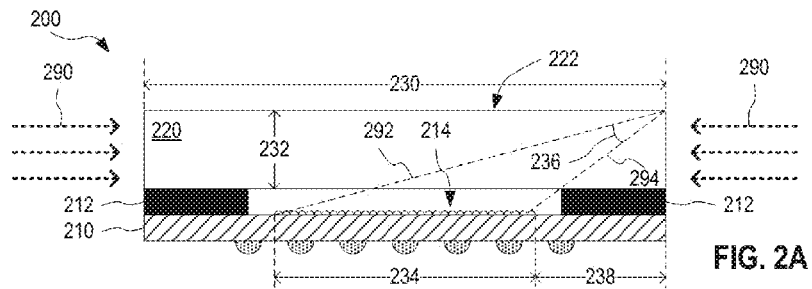
FIGS. 2A and 2B illustrate the problem of stray light detected by a conventional cover-glass covered image sensor that does not have black masking.
Figure 2B:
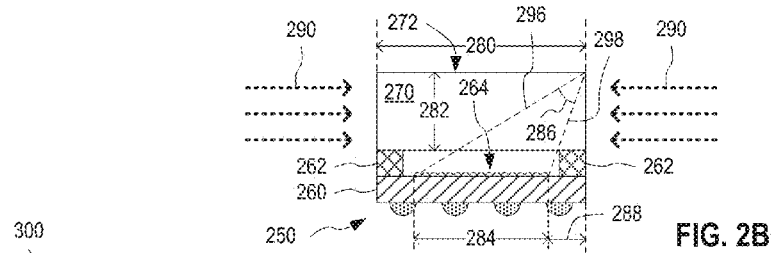

FIGS. 2A and 2B illustrate the problem of stray light detected by a conventional cover-glass covered image sensor that does not have black mask 142. FIG. 2A shows stray light 290 entering a cover-glass covered image sensor 200 having a larger transverse extent 230. FIG. 2B shows stray light 290 entering a cover-glass covered image sensor 250 having a smaller transverse extent 280. FIGS. 2A and 2B are best viewed together.

Cover-glass covered image sensor 200 includes an image sensor 210 and a cover glass 220 bonded to image sensor 210 via an opaque bonding layer 212. Image sensor 210 includes a photosensitive array 214 with transverse extent 234. Cover glass 220 has transverse extent 230 and height 232. Cover-glass covered image sensor 200 has a light-receiving surface 222. Light intended to be detected by photosensitive array 214 passes through light-receiving surface 222. However, in addition, stray light 290 enters cover glass 220 through its sides and may propagate to photosensitive array 214 and be detected thereby. Rays 292 and 294 are exemplary rays indicating the acceptance angle 236 of stray light 290 that is detectable by photosensitive array 214 and enters cover glass 230 at the location furthest from photosensitive array 214.

Cover-glass covered image sensor 250 is similar to cover-glass covered image sensor 200. Cover-glass covered image sensor 250 includes an image sensor 260 and a cover glass 270 bonded to image sensor 260 via an opaque bonding layer 262. Image sensor 260 includes a photosensitive array 264 with transverse extent 284. Cover glass 270 has transverse extent 280 and height 282. Cover-glass covered image sensor 250 has a light-receiving surface 272. Light intended to be detected by photosensitive array 264 passes through light-receiving surface 272. Height 282 is identical to height 232. Stray light 290 enters cover glass 270 through its sides and may propagate to photosensitive array 264 and be detected thereby. Rays 296 and 298 are exemplary rays indicating the acceptance angle 286 of stray light 290 that is detectable by photosensitive array 264 and enters cover glass 270 at the location furthest from photosensitive array 264.

The transverse distance 288 from photosensitive array 264 to the sides of cover glass 270 is significantly smaller than the transverse distance 238 from photosensitive array 214 to the sides of cover glass 220. Hence, acceptance angle 286 is greater than acceptance angle 236. Therefore, cover-glass covered image sensor 250 detects more stray light than cover-glass covered image sensor 200. In addition, since transverse extent 280 is smaller than transverse extent 230, the amount of light passing through light-receiving surface 272 to be detected by photosensitive array 264 of cover-glass covered image sensor 250 is less than the amount of light passing through light-receiving surface 222 to be detected by photosensitive array 214 of cover-glass covered image sensor 200. This further decreases the ratio in cover-glass covered image sensor 250 of (a) light reaching photosensitive array 264 through light-receiving surface 272 to (b) stray light 290 reaching photosensitive array 264, as compared to the corresponding ratio for cover-glass covered image sensor 200.

Accordingly, shrinking the transverse dimensions of an image sensor may produce undesirable stray light effects in the images captured by the image sensor if no measures are taken to block the stray light. Method 100 produces image sensors with a black mask configured to at least partly block stray light such as stray light 290. Method 100 thereby provides a solution to the stray light problem experienced by conventional cover-glass covered image sensors, especially those with small transverse extent.

Figure 3A:
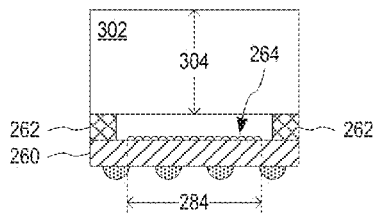
FIGS. 3A and 3B illustrate exemplary conventional cover-glass covered image sensors.
Figure 3B:
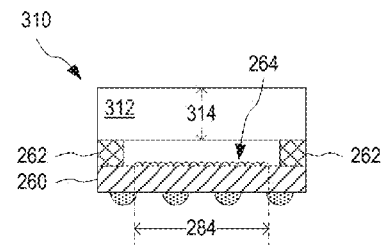
Figure 3C:
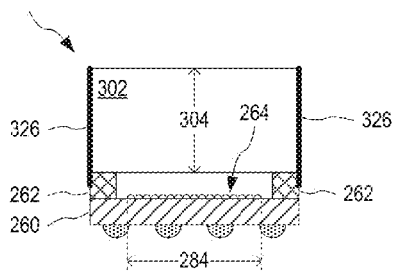
FIGS. 3C and 3D illustrate CSP image sensors with black masking, according to embodiments.
Figure 3D:
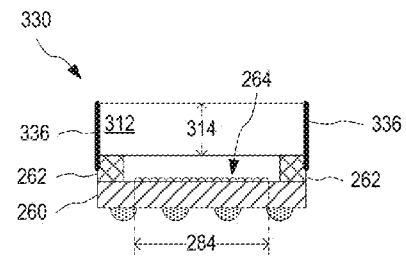

FIGS. 3A and 3B illustrate conventional cover-glass covered image sensors 300 and 310, respectively. Cover-glass covered image sensors 300 and 310 are similar to cover-glass covered image sensor 250. FIGS. 4A and 4B show, according to a simulation, images captured by cover-glass covered image sensors 300 and 310, respectively. FIGS. 3C and 3D illustrate CSP image sensors 320 and 330, respectively, with black masking. CSP image sensors 320 and 330 are embodiments of CSP image sensor 150 and may be produced using CSP image sensor packaging method 100. FIGS. 4C and 4D show, according to a simulation, images captured by CSP image sensors 320 and 330, respectively. All images shown in FIGS. 4A-D are of same size. FIG. 4E shows the intensity scale for each of FIGS. 4A-D. FIGS. 3A-D and 4A-E are best viewed together. FIGS. 3A-D and 4A-D demonstrate, by example, that CSP image sensor packaging method 100 is capable of producing CSP image sensors 150 with excellent stray-light suppression properties.

Cover-glass covered image sensor 300 is similar to cover-glass covered image sensor 250. Cover-glass covered image sensor 300 implements cover glass 270 as a cover glass 302 having height 304. Height 304 is 400 microns. In cover-glass covered image sensor 300, transverse extent 284 is 0.96 millimeters (mm). CSP image sensor 320 is similar to cover-glass covered image sensor 300 but further includes black mask 326. Black mask 326 is an embodiment of black mask 142. Black mask 326 extends along the full height of cover glass 302. FIG. 4A shows that the image captured by cover-glass covered image sensor 300 exhibits significant non-uniformity. In contrast, the image captured by CSP image sensor 320 (see FIG. 4C) is relatively uniform and does not reach as high intensity as the image captured by cover-glass covered image sensor 300. This demonstrates that black mask 326 blocks stray light 290 from being detected by CSP image sensor 320.

Cover-glass covered image sensor 310 is similar to cover-glass covered image sensor 300, except for having a cover glass 312 of height 314, wherein height 314 is 200 microns. CSP image sensor 330 is similar to cover-glass covered image sensor 310 except for having (a) cover glass 312 of height 314 and black mask 336. Black mask 336 is an embodiment of black mask 142. Black mask 336 extends along the full height of cover glass 312. FIG. 4B shows that the image captured by cover-glass covered image sensor 310 exhibits significant non-uniformity, although at a lower intensity level than that of FIG. 4A. The intensity reduction in FIG. 4B, as compared to FIG. 4A, is a result of height 314 of cover glass 312 being only half of height 304 of cover glass 302. Thus, it is possible to reduce the amount of stray light detected by a conventional cover-glass covered image sensor, not configured with a black mask, by reducing the height of the cover glass. However, the stray light issue is still noticeable in the captured images at a 200 micron cover glass height, and wafer-level manufacturing of image sensors with cover glass height much smaller than 200 micron is difficult due to the fragility of the very thin glass substrate required to achieve such small cover glass heights. FIG. 4D shows the image captured by CSP image sensor 330. The uniformity is excellent and the intensity level is low. This demonstrates that black mask 336 has a significant stray-light reducing effect even for a cover glass with a height of only 200 micron.

Figure 5:
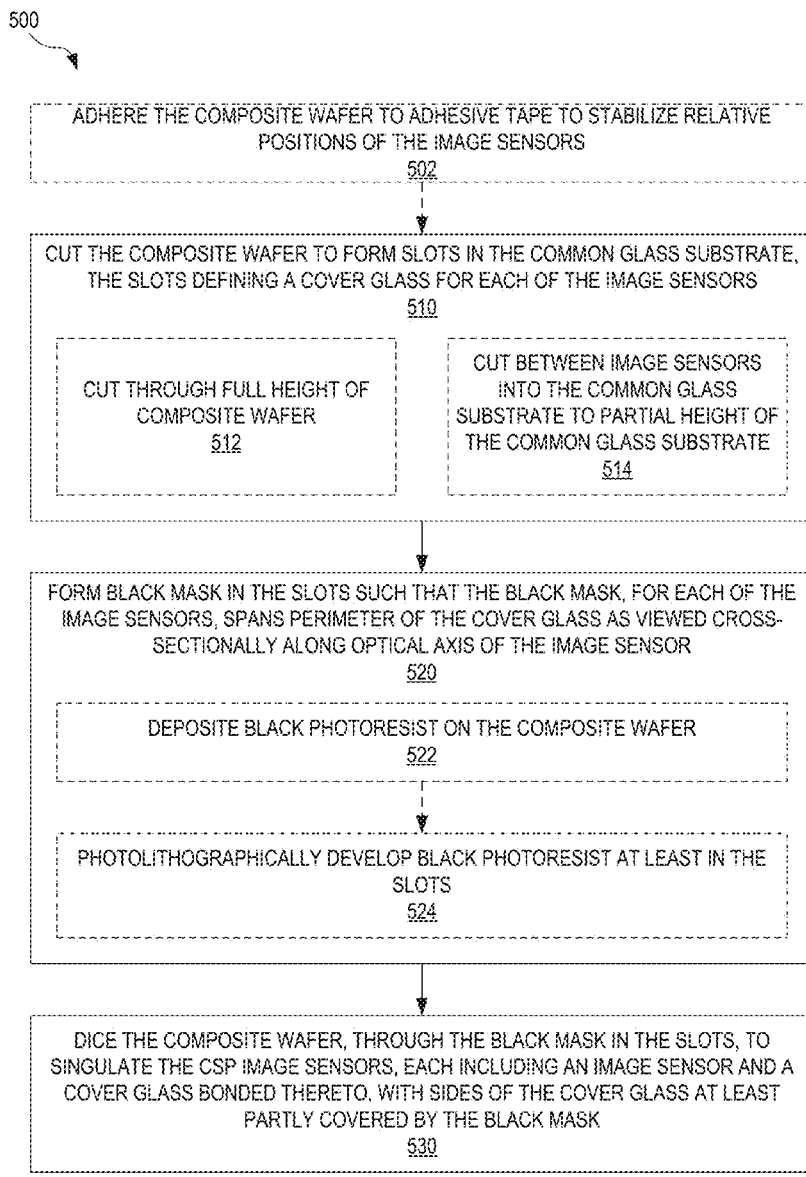
FIG. 5 is a flow chart illustrating the CSP image sensor packaging method of FIG. 1 in further detail, according to an embodiment.

FIG. 5 is a flow chart illustrating CSP image sensor packaging method 100 in further detail. In a step 510, method 100 cuts composite wafer 110 to form slots in common glass substrate 130. These slots are parallel to the optical axes 124 of image sensors 122, respectively, and are aligned with dividing lines between image sensors 122. The slots define, in common glass substrate 130, a cover glass 132 for each image sensor 122. Step 510 may utilize cutting methods as known in the art such as dicing or etching. In one embodiment, step 510 implements a step 512 of cutting through the full height of composite wafer 110 through the full height of common glass substrate 130. Herein, "height" refers to an extent in the dimension parallel to optical axes 124. In another embodiment, step 510 implements a step 514 of cutting composite wafer 110 between image sensors 122 and into common glass substrate 130 only to a partial height of common glass substrate 130, such that the slots do not fully penetrate common glass substrate 130.

In a step 520, method 100 forms a black mask in the slots such that the black mask, for each image sensor 122, spans the perimeter of cover glass 132 as viewed cross-sectionally along the corresponding optical axis 124. The black mask wraps around all sides of cover glass 132 facing away from optical axis 124, e.g., for a rectangular image sensor, the black mask wraps around four sides of cover glass 132. Step 520 includes applying black masking material 140 to composite wafer 110, at least in the slots formed in step 510.

In an embodiment, step 520 includes steps 522 and 524. In step 522, method 100 deposits black photoresist on composite wafer 110. In one example of step 522, the black photoresist is deposited on substantially all of the surface 112 of common glass substrate 130 facing away from image sensors 122, as well as in the slots. In another example of step 522, the black photoresist is deposited on substantially all of the surface 114 of composite wafer 110 opposite surface 112. The black photoresist is an example of black masking material 140. In step 524, method 100 photolithographically develops the black photoresist, at least in the slots.

In a step 530, method 100 dices composite wafer 110 to singulate CSP image sensors 150 from composite wafer 110. Each CSP image sensor 150 includes an image sensor 122 and a cover glass 132 bonded thereto, wherein sides of cover glass 132 facing away from optical axis 126 are at least partly covered by black mask 142. Black mask 142 may take the form of a coating with thickness in the range from one micron to 200 microns.

Figure 6:
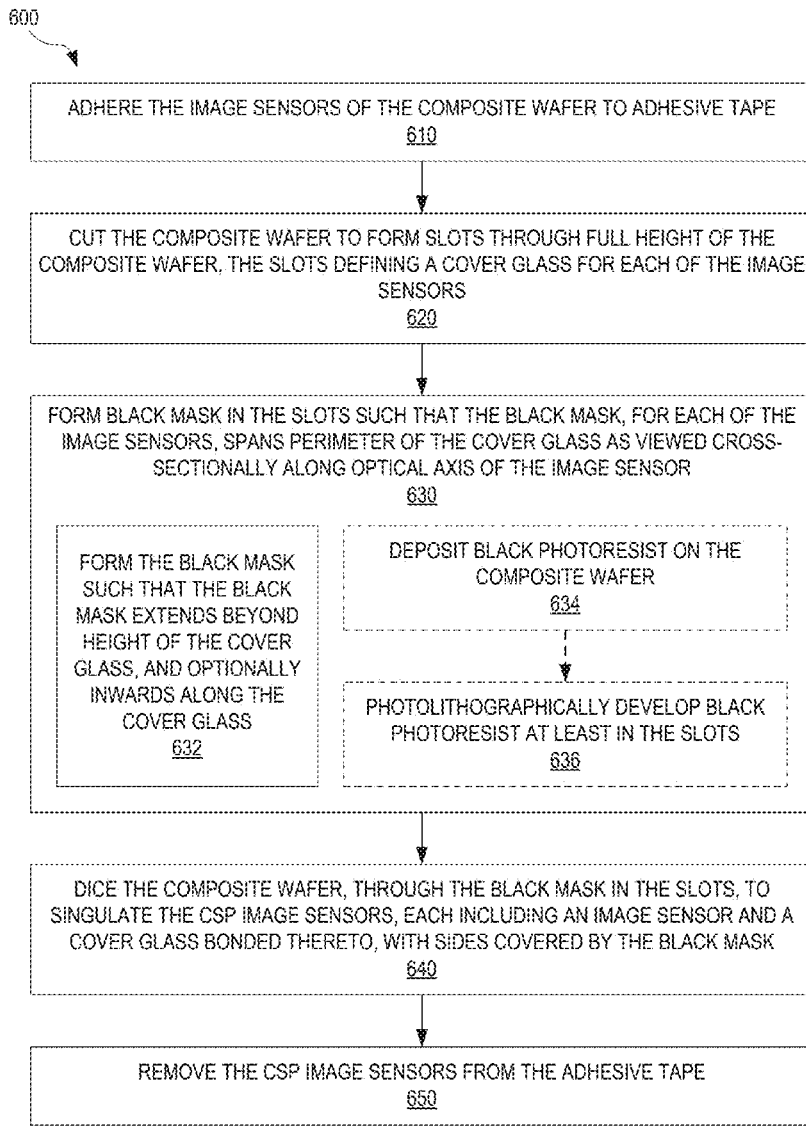
FIG. 6 illustrates a CSP image sensor packaging method, wherein image sensors of a composite wafer are bonded to an adhesive tape, according to an embodiment.

FIG. 6 illustrates one exemplary CSP image sensor packaging method 600 wherein image sensors 122 of composite wafer 110 are bonded to an adhesive tape. Method 600 is an embodiment of method 100 and produces embodiments of CSP image sensors 150 having black mask 142 spanning the full height of the sides of cover glass 132 facing away from optical axis 126. FIGS. 7A-G illustrate, by example, steps of method 600 based upon a composite wafer 700, as well as an exemplary CSP image sensor 760 produced by method 600. FIGS. 6 and 7A-G are best viewed together.

Figure 7A:
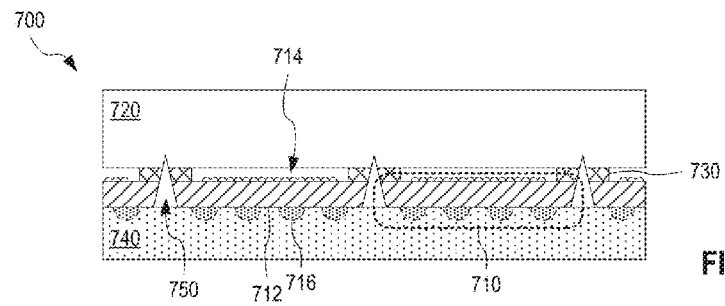
FIGS. 7A-G illustrate, by example, steps of the method of FIG. 6, as well as an exemplary CSP image sensor produced by the method of FIG. 6.
Figure 7B:
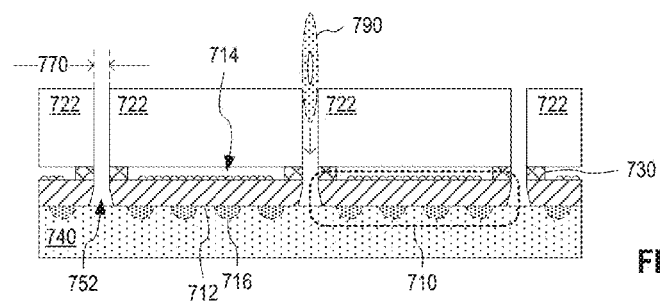

In a step 610, image sensors 122 of composite wafer 110 are adhered to an adhesive tape. The adhesive tape may be dicing tape as known in the art. The adhesive tape serves at least to stabilize the relative positioning of image sensors 122 during subsequent steps of method 600 until after singulation of CSP image sensors 150 from composite wafer 110. In one example of step 610, a plurality of image sensors 710 of a composite wafer 700 (see FIG. 7A) are adhered to an adhesive tape 740. FIG. 7A shows a portion of composite wafer 700 in cross-sectional view. Composite wafer 700 includes a common glass substrate 720 and image sensors 710 bonded to common glass substrate 720 via a bonding layer 730. Composite wafer 700 is an embodiment of composite wafer 110, and image sensor 710 is an embodiment of image sensor 122. Image sensor 710 includes a sensor substrate 712 and a photosensitive array 714. Image sensor 710 may further include solder-bump electrical contacts 716. FIG. 7A shows recesses 750 between each pair of image sensors 710. Without departing from the scope hereof, recesses 750 may be of shape and size different from that shown in FIG. 7A. Furthermore, recesses 750 may be omitted such that image sensors 710 cooperate to form an image sensor wafer, i.e., an embodiment of image sensor wafer 120.

In a step 620, composite wafer 110 is cut to form slots through the full height of composite wafer 110. These slots are parallel to the optical axes 124 of image sensors 122, respectively, and are aligned with dividing lines between image sensors 122. The slots define, in common glass substrate 130, a cover glass 132 for each image sensor 122. Step 620 may utilize cutting methods as known in the art such as dicing or etching. Step 620 is an embodiment of step 510 implementing step 512. In one example of step 620, a cutting tool 790 forms slots 752 (see FIG. 7B) in composite wafer 700 from the side of composite wafer 700 associated with common glass substrate 720. The slots define a cover glass 722 for each image sensor 710. Slots 752 have width 770. Width 770 is for example in the range from 20 microns to 100 microns.

In a step 630, method 600 forms black mask in the slots formed in step 620, such that the black mask, for each image sensor 122, spans the perimeter of the associated cover glass 132 as viewed cross-sectionally along optical axis 124. Step 630 is an embodiment of step 520. Step 630 includes a step 632 that forms the black mask such that the black mask extends beyond the height of cover glass 132 and, optionally, inwards along light-receiving surface 134 of cover glass 132 in direction towards optical axis 126. In an embodiment, step 630 includes steps 634 and 636. Step 634 deposits black photoresist on surface 112 of composite wafer 110 and in the slots formed in step 620. The black photoresist is an example of black masking material 140. Step 636 photolithographically develops the black photoresist at least in the slots.

Figure 7C:
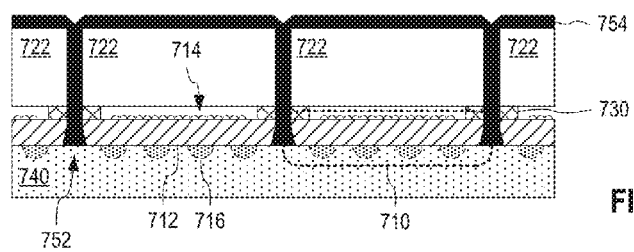
Figure 7D:
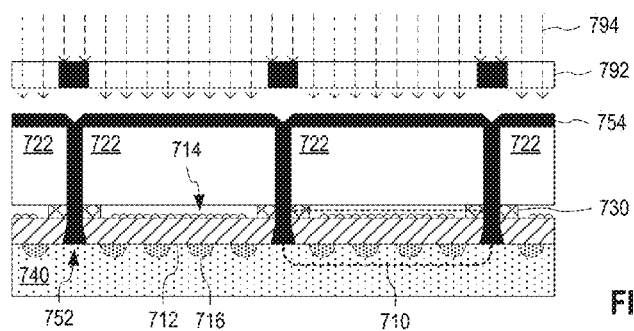
Figure 7E:
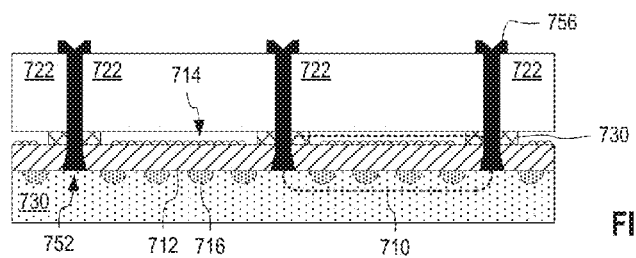
Figure 7F:
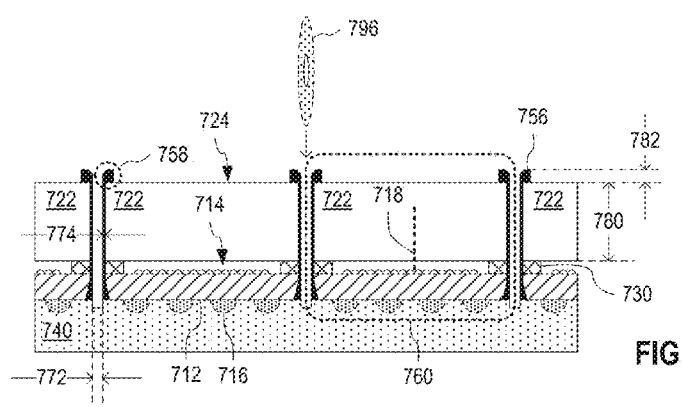
Figure 7G:
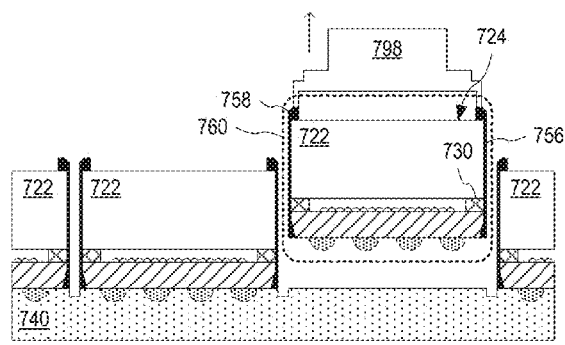

FIGS. 7C-E cooperatively show one example of step 630 that implements steps 632, 634, and 636. In step 634, black photoresist 754 is deposited on each cover glass 722 and in each slot 752 (see FIG. 7C). In step 636, a mask 792 is placed over composite wafer 700 and UV light 794 is directed toward composite wafer 700 through non-opaque openings of mask 792 (see FIG. 7D). Black photoresist 754 exposed to UV light 794 becomes soluble in a photoresist developer solution, while black photoresist 754 not exposed to UV light 794 becomes insoluble in the photoresist developer solution. Mask 794 blocks UV light 794 over slots 752 and, optionally, in a region extending away from slots 752 by a finite distance. Next, composite wafer 700 is exposed to a photoresist developer solution that removes black photoresist 754 exposed to UV light 794 (See FIG. 7E). This forms a black mask 756 in and near slots 752. FIGS. 7D and 7E assume that the black photoresist 754 is a positive photoresist. Without departing from the scope hereof, black photoresist 754 may be a negative photoresist, in which case mask 792 is replaced by an inverse mask.

In a step 640, method 600 dices composite wafer 110, through the black mask formed in the slots in step 630. Step 640 thereby singulates CSP image sensors 150, wherein black mask 142 covers the sides of cover glass 132 facing away from optical axis 126 through the full height of cover glass 132. In one example of step 640, a cutting tool 796 dices composite wafer 700 through black mask 756 in each slot 752, to form a respective slot 755 therein. Slot 755 has width 772. Width 772 is for example in the range from 20 microns to 100 microns. This forms a plurality of CSP image sensors 760. Each CSP image sensor 760 is an embodiment of CSP image sensor 150 and includes image sensor 710, a portion of bonding layer 730, and cover glass 722. Sides of cover glass 722 facing away from the optical axis 718 of image sensor 710 are covered by black mask 756 along the full height 780 of cover glass 722. Along these sides, black mask 756 has thickness 774. Thickness 774 is for example in the range from one micron to 50 microns. Each CSP image sensor 760 further includes a protruding portion 758 that extends beyond height 780 by a distance 782 and inwards along a light receiving surface 724 of cover glass 722 in the direction toward optical axis 718. Without departing from the scope hereof, mask 792 of FIG. 7D may be configured to not form protruding portions 758.

In a step 650, method 600 removes CSP image sensors 150 from the adhesive tape. In one example of step 650, a pick-and-place device 798 removes each CSP image sensor 760 from adhesive tape 740. Embodiments of CSP image sensor 150 including protruding portion 758 may couple with pick-and-place device 798 at protruding portion 758, such that light-receiving surface 724 is protected from potentially being damaged by contacting pick-and-place device 798.

Figure 8A:
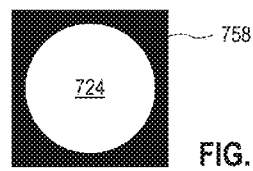
FIG. 8A illustrates a CSP image sensor with a black mask that forms a circular aperture on the light-receiving surface of the CSP image sensor, according to an embodiment.

FIG. 8A illustrates one exemplary embodiment of CSP image sensor 760, wherein protruding portion 758 forms a circular aperture on light-receiving surface 724.

Figure 8B:
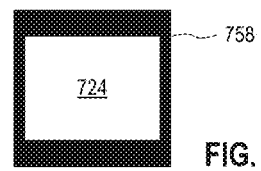
FIG. 8B illustrates a CSP image sensor with a black mask that forms a rectangular aperture on the light-receiving surface of the CSP image sensor, according to an embodiment.

FIG. 8B illustrates another exemplary embodiment of CSP image sensor 760, wherein protruding portion 758 forms a rectangular aperture on light-receiving surface 724.

FIGS. 8A and 8B illustrate, by example, that method 600 may form an aperture of any shape on light-receiving surface 134 of CSP image sensor 150.

Figure 9:
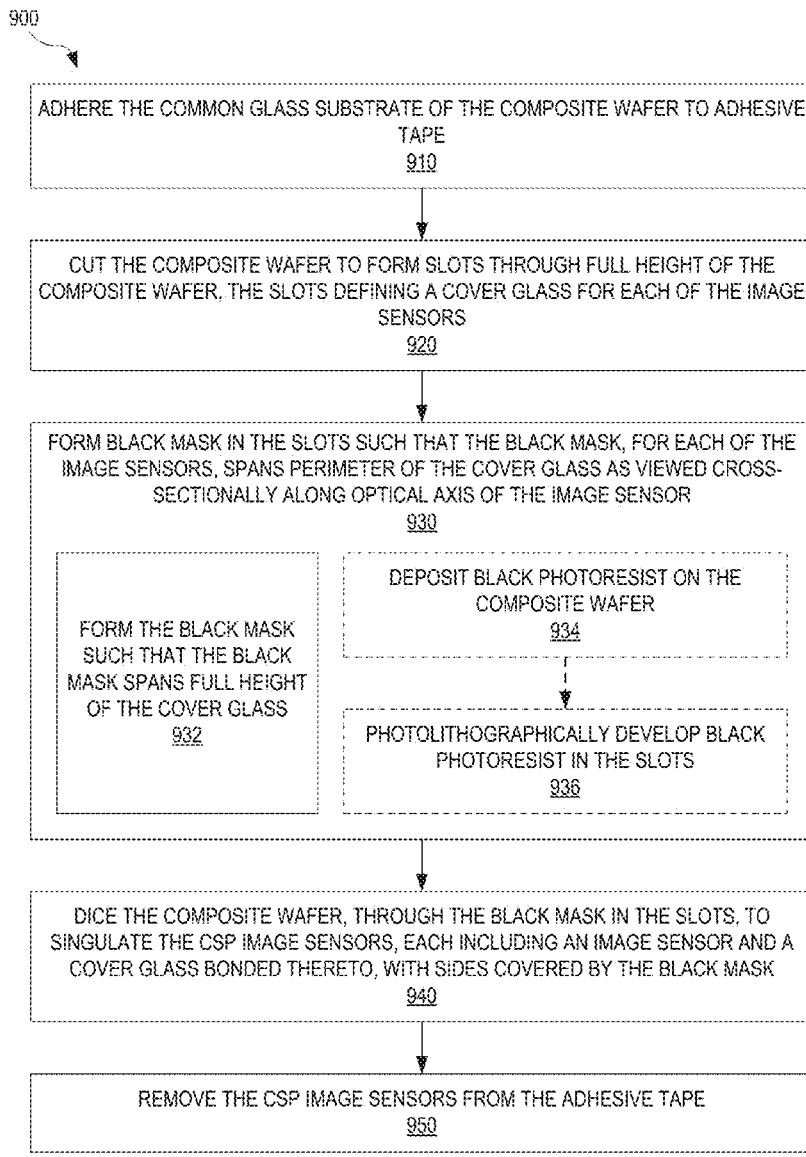
FIG. 9 illustrates a CSP image sensor packaging method, wherein a common glass substrate of a composite wafer are bonded to an adhesive tape, according to an embodiment.

FIG. 9 illustrates one exemplary CSP image sensor packaging method 900 wherein common glass substrate 130 of composite wafer 110 is bonded to an adhesive tape. Method 900 is an embodiment of method 100 and produces embodiments of CSP image sensors 150 having black mask 142 spanning the full height of the sides of cover glass 132 facing away from optical axis 126. FIGS. 10A-G illustrate, by example, steps of method 900 based upon composite wafer 700, as well as an exemplary CSP image sensor 1060 produced by method 900. FIGS. 9 and 10A-G are best viewed together.

Figure 10A:
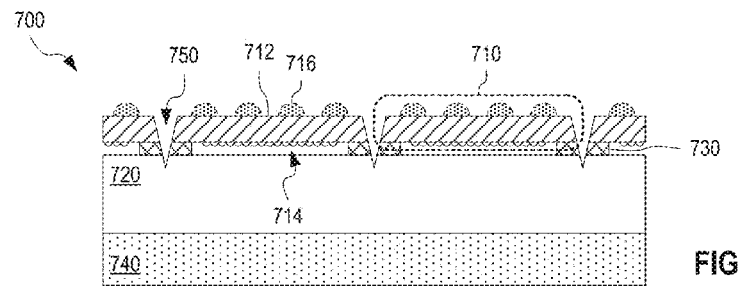
FIGS. 10A-G illustrate, by example, steps of the method of FIG. 9, as well as an exemplary CSP image sensor produced by the method of FIG. 9.
Figure 10B:
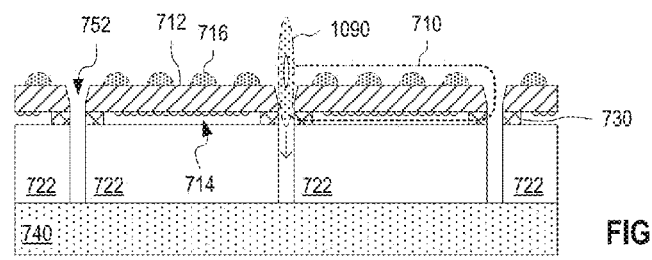

In a step 910, common glass substrate 130 of composite wafer 110 is adhered to an adhesive tape. The adhesive tape may be dicing tape as known in the art. The adhesive tape serves at least to stabilize the relative positioning of image sensors 122 during subsequent steps of method 900 until after singulation of CSP image sensors 150 from composite wafer 110. In one example of step 910, common glass substrate 720 of composite wafer 700 (see FIG. 10A) is adhered to adhesive tape 740. FIG. 10A shows a portion of composite wafer 700 in cross-sectional view. FIG. 10A shows recesses 750 between each pair of image sensors 710. Without departing from the scope hereof, recesses 750 may be of shape and size different from that shown in FIG. 10A. Furthermore, recesses 750 may be omitted such that image sensors 710 cooperate to form an image sensor wafer, i.e., an embodiment of image sensor wafer 120.

In a step 920, composite wafer 110 is cut to form slots through the full height of composite wafer 110. These slots are parallel to the optical axes 124 of image sensors 122, respectively, and are aligned with dividing lines between image sensors 122. The slots define, in common glass substrate 130, a cover glass 132 for each image sensor 122. Step 920 may utilize cutting methods as known in the art such as dicing or etching. Step 920 is an embodiment of step 510 implementing step 512. In one example of step 920, a cutting tool 1090 forms slots 752 (see FIG. 10B) in composite wafer 700 from the side of composite wafer 700 associated with image sensors 710. The slots define cover glass 722 for each image sensor 710.

In a step 930, method 900 forms black mask in the slots formed in step 920, such that the black mask, for each image sensor 122, spans the perimeter of the associated cover glass 132 as viewed cross-sectionally along optical axis 124. Step 930 is an embodiment of step 520. Step 930 includes a step 932 that forms the black mask such that the black mask spans the full height of cover glass 132. In an embodiment, step 930 includes steps 934 and 936. Step 934 deposits black photoresist on surface 114 of composite wafer 110 and in the slots formed in step 920. The black photoresist is an example of black masking material 140. Step 936 photolithographically develops the black photoresist in the slots.

Figure 10C:
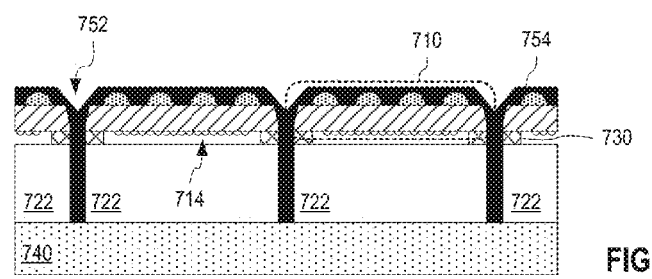
Figure 10D:
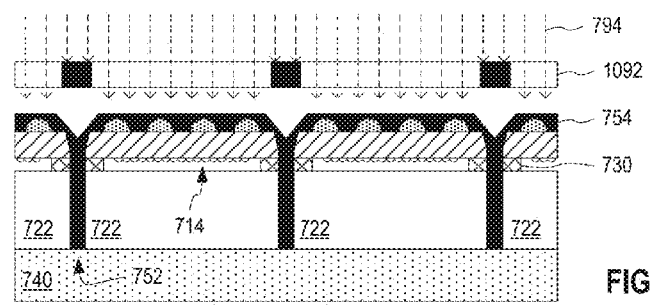
Figure 10E:
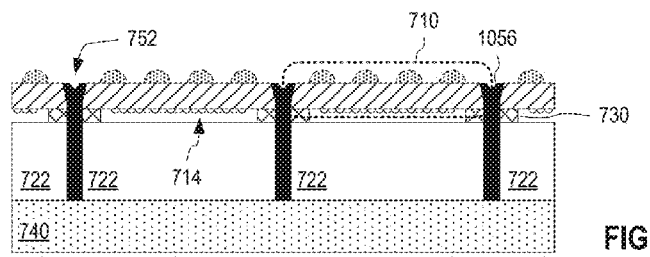
Figure 10F:
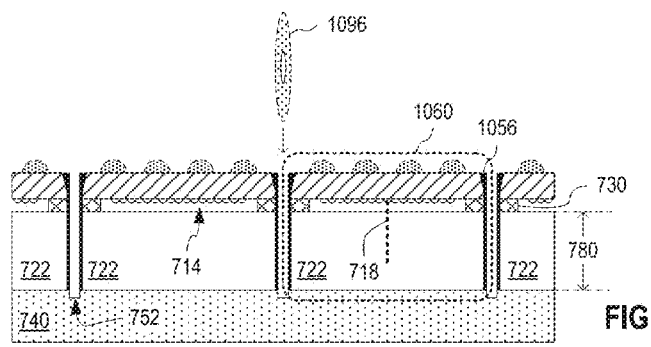
Figure 10G:
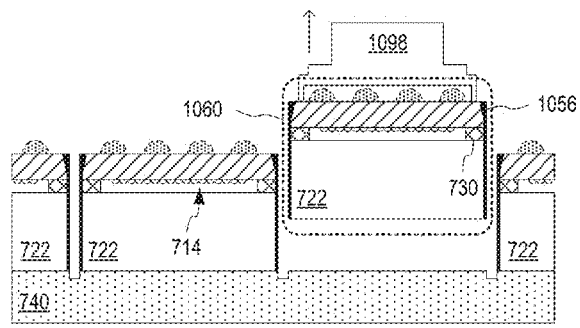

FIGS. 10C-E cooperatively show one example of step 930 that implements steps 932, 934, and 936. In step 934, black photoresist 754 is deposited on each image sensor 710 and in each slot 752 (see FIG. 10C). In step 936, a mask 1092 is placed over composite wafer 700 and UV light 794 is directed toward composite wafer 700 through non-opaque openings of mask 1092 (see FIG. 10D). Black photoresist 754 exposed to UV light 794 becomes soluble in a photoresist developer solution, while black photoresist 754 not exposed to UV light 794 becomes insoluble in the photoresist developer solution. Mask 1092 blocks UV light 794 over slots 752. Next, composite wafer 700 is exposed to a photoresist developer solution that removes black photoresist 754 exposed to UV light 794 (See FIG. 10E). This forms a black mask 1056 in slots 752. FIGS. 10D and 10E assume that the black photoresist 754 is a positive photoresist. Without departing from the scope hereof, black photoresist 754 may be a negative photoresist, in which case mask 1092 is replaced by an inverse mask.

In a step 940, method 900 dices composite wafer 110, through the black mask formed in the slots in step 930. Step 940 thereby singulates CSP image sensors 150, wherein black mask 142 covers the sides of cover glass 132 facing away from optical axis 126 through the full height of cover glass 132. In one example of step 940, a cutting tool 1096 dices composite wafer 700 through black mask 1056 in each slot 752. This forms a plurality of CSP image sensors 1060. Each CSP image sensor 1060 is an embodiment of CSP image sensor 150 and includes image sensor 710, a portion of bonding layer 730, and cover glass 722. Sides of cover glass 722 facing away from the optical axis 718 of image sensor 710 are covered by black mask 1056 along the full height 780 of cover glass 722.

In a step 950, method 900 removes CSP image sensors 150 from the adhesive tape. In one example of step 950, a pick-and-place device 1098 removes each CSP image sensor 1060 from adhesive tape 740. Pick-and-place device 798 couples to image sensor 710 and/or black mask 1056.

Figure 11:
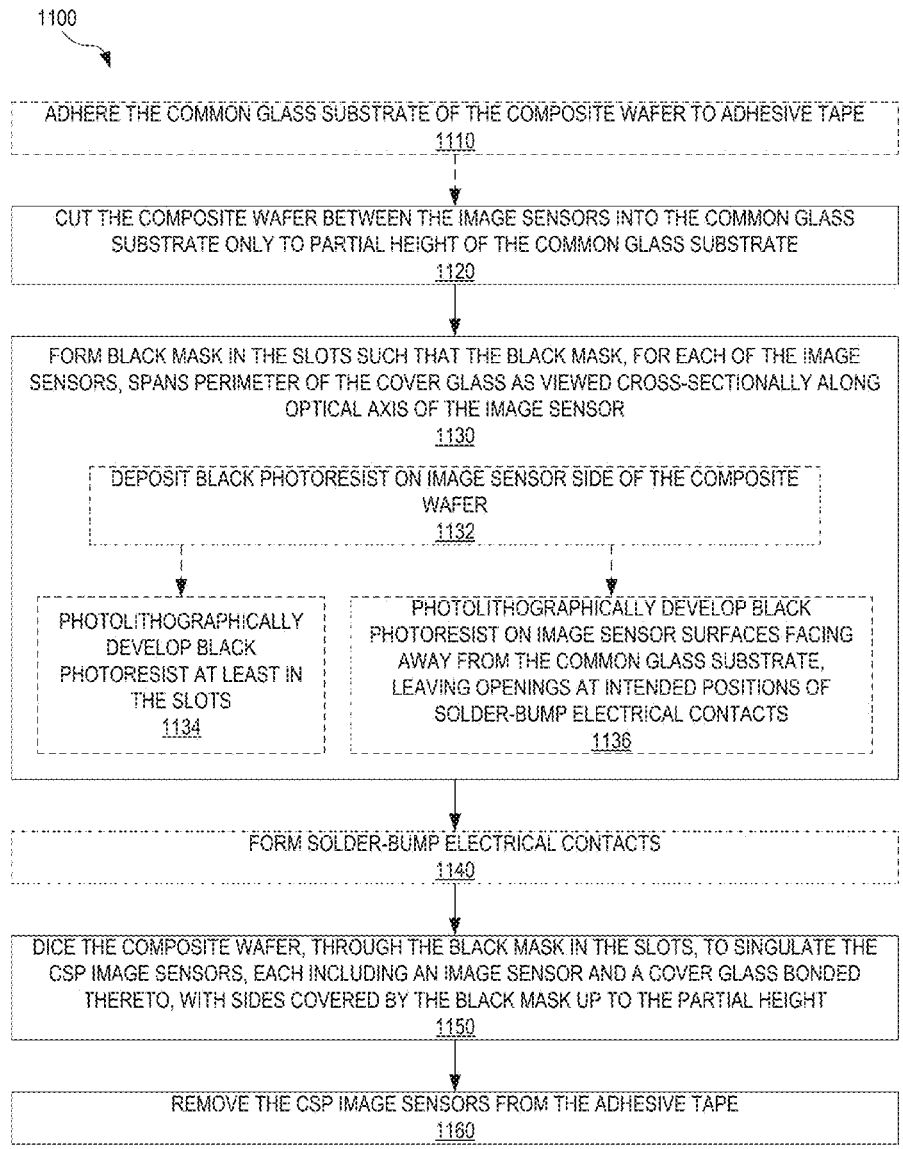
FIG. 11 illustrates a CSP image sensor packaging method that forms slots only to a partial height of a common glass substrate before applying black masking, according to an embodiment.

FIG. 11 illustrates one exemplary CSP image sensor packaging method 1100 that forms slots only to partial height of common glass substrate 130 before applying black masking. Method 1100 is an embodiment of method 100 and produces embodiments of CSP image sensors 150 having black mask 142 on the sides of cover glass 132 facing away from optical axis 126. Method 1100 may include forming solder-bump electrical contacts on image sensors 122. In the CSP image sensors 150 produced by method 1100, black mask 142 covers the sides only up to a partial height of cover glass 132. FIGS. 12A-H illustrate, by example, steps of method 1100 based upon a composite wafer 1200, as well as an exemplary CSP image sensor 1260 produced by method 1100. FIGS. 11 and 12A-G are best viewed together.

Figure 12A:
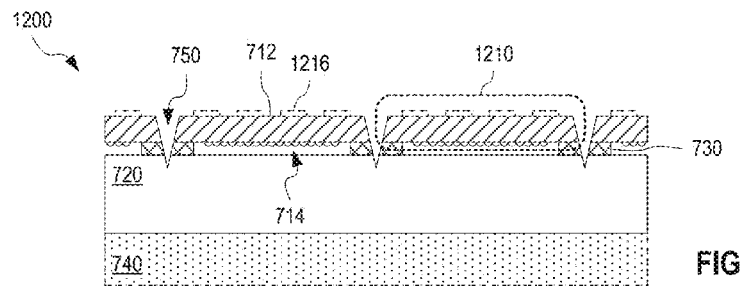
FIGS. 12A-H illustrate, by example, steps of the method of FIG. 11, as well as an exemplary CSP image sensor produced by the method of FIG. 11.
Figure 12B:
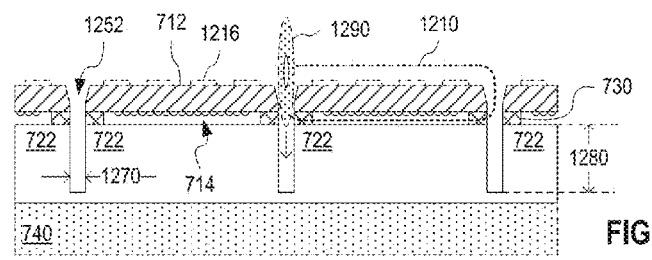

In a step 1120, composite wafer 110 is cut to form slots in common glass substrate only to partial height of common glass substrate 130. The cuts are made from side 112 of composite wafer 110. The slots are parallel to the optical axes 124 of image sensors 122, respectively, and are aligned with dividing lines between image sensors 122. The slots define, in common glass substrate 130, a cover glass 132 for each image sensor 122, although each cover glass 132 is still partly connected to adjacent instances of cover glass 132. Step 1120 may utilize cutting methods as known in the art such as dicing or etching. Step 1120 is an embodiment of step 510 implementing step 514. In one example of step 1120, a cutting tool 1290 forms slots 1252 (see FIG. 12B) in a composite wafer 1200 from the side of composite wafer 1200 associated with a plurality of image sensors 1210. Slots 1252 extend only to a partial height 1280 of common glass substrate 720. Slots 1252 define cover glass 722 for each image sensor 1210, although each cover glass 722 is still partly connected to adjacent instances of cover glass 722. Slots 1252 have width 1270. Width 1270 is for example in the range from 20 microns to 100 microns. Composite wafer 1200 is an embodiment of composite wafer 110. Composite wafer 1200 is similar to composite wafer 700 except for image sensors 710 being replaced by image sensors 1210. Image sensors 1210 may omit solder-bump electrical contacts 716 and instead include electrical contact areas 1216. Each electrical contact area 1216 is configured to accommodate a solder-bump electrical contact, such as a solder-bump electrical contact 716. Although FIG. 12B shows electrical contact areas 1216 as protruding from image sensor 1210, electrical contact areas 1216 may be flush with adjacent surface portions of image sensor 1210, without departing from the scope hereof.

Optionally, method 1100 includes a step 1110 of adhering composite wafer 110 to an adhesive tape as discussed in reference to step 910 of method 900. This adhesive tape may serve to keep image sensors 122, and cover glass 132 bonded thereto, in place during a subsequent step 1150 of singulating CSP image sensors 150 from composite wafer 110. In certain implementations of method 1100, it is beneficial to perform step 1110 before step 1120 since slots formed in step 1120 may make composite wafer 110 too fragile to move and adhere to the adhesive tape without risking breakage of composite wafer 110 at the slots. In one example of step 1110, composite wafer 1200 is adhered to adhesive tape 740 (see FIG. 12A) prior to step 1120. Without departing from the scope hereof, method 1100 may incorporate step 1110 at a later time, for example prior to step 1140.

In a step 1130, method 1100 forms black mask in the slots formed in step 1120, such that the black mask, for each image sensor 122, spans the perimeter of the associated cover glass 132 as viewed cross-sectionally along optical axis 124. Step 1130 is an embodiment of step 520. In an embodiment, step 1130 includes steps 1132 and 1134. Step 1132 deposits black photoresist on surface 114 of composite wafer 110 and in the slots formed in step 1120. The black photoresist is an example of black masking material 140. Step 1132 photolithographically develops the black photoresist in the slots. In certain embodiments, step 1130 further includes a step 1136 that photolithographically develops the black photoresist on surfaces of image sensors 122 facing away from common glass substrate 130. Step 1136 develops the black photoresist to leave openings in the black photoresist at locations that correspond to intended positions of solder-bump electrical contacts not yet formed on image sensors 122.

Figure 12C:
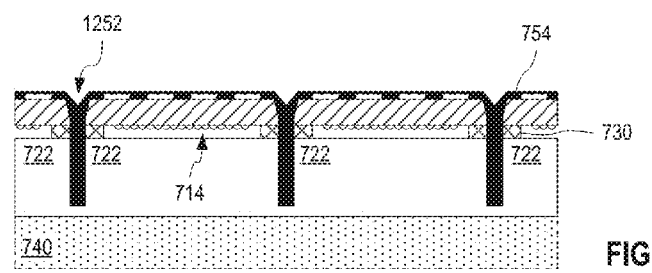
Figure 12D:
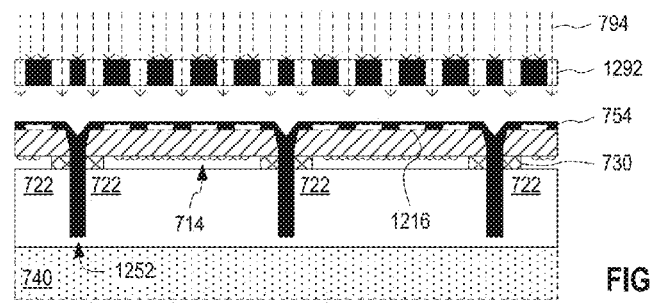
Figure 12E:
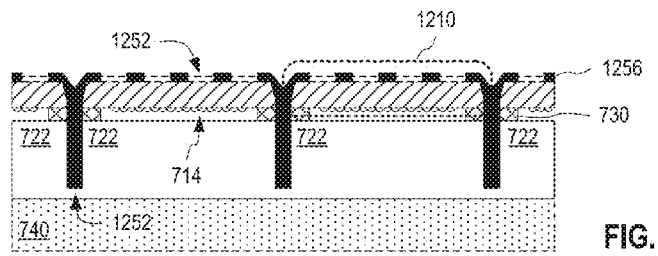
Figure 12F:
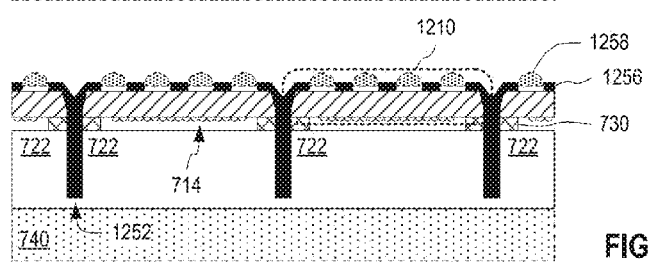
Figure 12G:
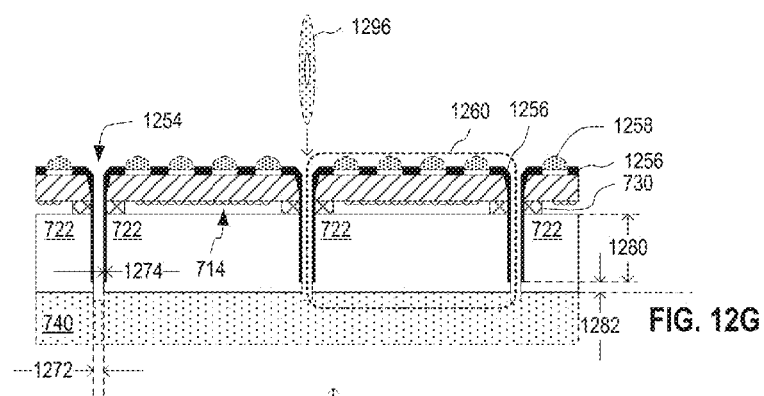
Figure 12H:
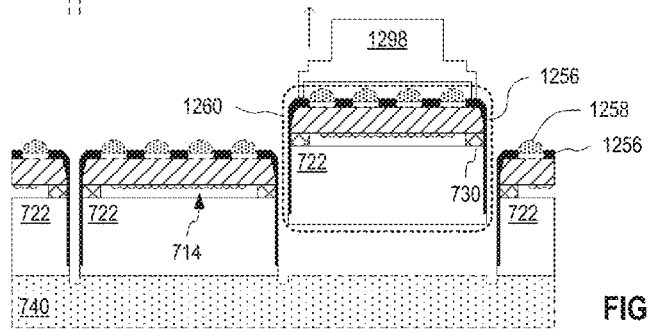

FIGS. 12C-E cooperatively show one example of step 1130 that implements steps 1132, 1134, and 1136. In step 1132, black photoresist 754 is deposited on each image sensor 1210 and in each slot 1252 (see FIG. 12C). To perform steps 1134 and 1136, a mask 1292 is placed over composite wafer 1200 and UV light 794 is directed toward composite wafer 1200 through non-opaque openings of mask 1292 (see FIG. 12D). Black photoresist 754 exposed to UV light 794 becomes soluble in a photoresist developer solution, while black photoresist 754 not exposed to UV light 794 becomes insoluble in the photoresist developer solution. Mask 1294 blocks UV light 794 over slots 752 and over electrical contact areas 1216. Next, composite wafer 1200 is exposed to a photoresist developer solution that removes black photoresist 754 exposed to UV light 794 (See FIG. 12E). This forms a black mask 1256 in slots 752 and on image sensors 1210 except for at electrical contact areas 1216. FIGS. 12D and 12E assume that the black photoresist 754 is a positive photoresist. Without departing from the scope hereof, black photoresist 754 may be a negative photoresist, in which case mask 1292 is replaced by an inverse mask.

In an optional step 1140, method 1100 forms solder-bump electrical contacts on image sensors 122. In one example of step 1150, a solder-bump electrical contact 1258 is formed on each electrical contact area 1216, using black mask 1256 as a solder mask. By virtue of slots 1252 extending only through partial height 1280 of common glass substrate 720, the relative positioning of image sensors 1210 may be more stable than what would be achievable if slots 1252 extended through the full height of common glass substrate 720, in which case the only means of stabilizing the relative positioning of image sensors 1210 would be use of adhesive tape 740. This added stability may serve to provide improved accuracy when forming solder-bump electrical contacts 1258.

In a step 1150, method 1100 dices composite wafer 110, through the black mask formed in the slots in step 1130 and through the full height of composite wafer 110. Step 1150 thereby singulates CSP image sensors 150, wherein black mask 142 covers the sides of cover glass 132 facing away from optical axis 126 but only through a partial height of cover glass 132. In one example of step 1150, a cutting tool 1296 dices composite wafer 1200 through black mask 1256 in each slot 1252 to form a slot 1254 that spans the full height of composite wafer 1200. Slot 1254 has width 1272. Width 1272 is for example in the range from 20 microns to 100 microns. This forms a plurality of CSP image sensors 1260. Each CSP image sensor 1260 is an embodiment of CSP image sensor 150 and includes image sensor 1210, a portion of bonding layer 730, and cover glass 722. Sides of cover glass 722 facing away from the optical axis 718 of image sensor 710 are covered by black mask 1256 to partial height 1280 of cover glass 722. Along these sides, black mask 1256 has thickness 1274. Thickness 1274 is for example in the range from 1 micron to 50 microns. A portion of these sides, furthest from image sensor 1210 and of height 1282 is not covered by black mask 1256. However, height 1282 may be made small compared to partial height 1280 to minimize the amount of stray light that can enter CSP image sensor 150 through the sides of cover glass 722. In one example, height 1282 is between 5% and 20% of partial height 1280. The portion of the sides associated with height 1282 is flush with black mask 1256 on the portion of the sides associated with partial height 1280.

In a step 1160, method 1100 removes CSP image sensors 150 from the adhesive tape. In one example of step 1160, a pick-and-place device 1298 removes each CSP image sensor 1260 from adhesive tape 740 or from another support structure used in place of adhesive tape 740. Pick-and-place device 1298 couples to image sensor 1210 and/or black mask 1256.

Combinations of Features

Features described above as well as those claimed below may be combined in various ways without departing from the scope hereof. For example, it will be appreciated that aspects of one chip-scale packaged image sensor with black masking, or associated packaging method, described herein may incorporate or swap features of another chip-scale packaged image sensor with black masking, or associated packaging method, described herein. The following examples illustrate possible, non-limiting combinations of embodiments described above. It should be clear that many other changes and modifications may be made to the methods and device herein without departing from the spirit and scope of this invention:

(A1) A chip-scale image sensor packaging method with black masking may include (a) cutting a composite wafer, having a plurality of image sensors bonded to a common glass substrate, to form slots in the common glass substrate, wherein the slots define a cover glass for each of the image sensors, respectively, and (b) forming black mask in the slots such that the black mask, for each of the image sensors, spans perimeter of the cover glass as viewed cross-sectionally along optical axis of the image sensors.

(A2) The chip-scale image sensor packaging method denoted as (A1) may further include dicing through the black mask in the slots to singulate a plurality of chip-scale packaged image sensors each including one of the image sensors and the cover glass bonded thereto, with sides of the cover glass facing away from the optical axis being at least partly covered by the black mask.

(A3) Either or both of the chip-scale image sensor packaging methods denoted as (A1) and (A2) may further include, prior to the step of cutting, adhering the composite wafer to an adhesive tape to stabilize relative positions of the image sensors until the step of dicing.

(A4) The chip-scale image sensor packaging method denoted as (A3) may further include, in the step of cutting, cutting through the full height of the composite wafer in dimension parallel to the optical axis.

(A5) In the chip-scale image sensor packaging method denoted as (A4) the step of forming may include forming the black mask such that the black mask, for each of the chip-scale packaged image sensors, extends along the full height of the sides in dimension parallel to the optical axis.

(A6) In any of the chip-scale image sensor packaging methods denoted as (A3) through (A5), the step of adhering may include adhering the image sensors directly to the adhesive tape such that the common glass substrate faces away from the adhesive tape.

(A7) In the chip-scale image sensor packaging method denoted as (A6), the step of forming may include (a) depositing black photo resist on the composite wafer and (b) photolithographically developing the black photo resist such that the black mask, for each of the chip-scale packaged image sensors, extends inwards along at least a portion of light receiving surface of the cover glass to define an aperture for receiving light.

(A8) Either or both of the chip-scale image sensor packaging methods denoted as (A6) and (A7) may include, in the step of forming, (a) depositing black photo resist on the composite wafer, and (b) photolithographically developing the black photo resist such that the black mask, for each of the chip-scale packaged image sensors, includes a protruding portion extending beyond light receiving surface of the cover glass in dimension parallel to the optical axis.

(A9) The chip-scale image sensor packaging method denoted as (A8) may include (a) dicing through the black mask in the slots to singulate a plurality of chip-scale packaged image sensors each including one of the image sensors and the cover glass bonded thereto, and (b) after the step of dicing, removing the chip-scale packaged image sensors from the adhesive tape using, for each of the chip-scale packaged image sensors, pick-and-place equipment coupled to the protruding portion.

(A10) In any of the chip-scale image sensor packaging methods denoted as (A3) through (A5), the step of adhering may include adhering the common glass substrate directly to the adhesive tape.

(A11) In the chip-scale image sensor packaging method denoted as (A10), the step of forming may include depositing black photo resist on the composite wafer and photolithographically developing the black photo resist such that electrical contacts of the image sensors are accessible after forming the black mask.

(A12) In either or both of the chip-scale image sensor packaging methods denoted as (A1) and (A2), the step of cutting may include cutting between the image sensors into the common glass substrate only to partial height of the common glass substrate, in dimension parallel to the optical axis, such that the slots extend only to the partial height.

(A13) In the chip-scale image sensor packaging method denoted as (A12), the step of forming may include forming the black mask through all of the partial height of the common glass substrate.

(A14) In either or both of the chip-scale image sensor packaging methods denoted as (A12) and (A13), the step of forming may include (a) depositing black photo resist on composite wafer, including in the slots and on surfaces of the image sensors, respectively, facing away from the common glass substrate, and (b) photolithographically developing the black photo resist to form the black mask both in the slots and on the surfaces with openings in the black mask matching intended positions of solder-bump electrical contacts of the image sensors.

(A15) The chip-scale image sensor packaging method denoted as (A14) may further include making the solder-bump electrical contacts of the image sensors using the black mask as a solder mask.

(A16) Any of the chip-scale image sensor packaging methods denoted as (A12) through (A15) may further include, prior to the step of cutting, adhering the common glass substrate of the composite wafer to an adhesive tape to stabilize the composite wafer.

(B1) A chip-scale packaged image sensor may include an image sensor, a cover glass bonded to the image sensor, and a black mask on sides of the cover glass facing away from optical axis of the image sensor.

(B2) In the chip-scale packaged image sensor denoted as (B1), the black mask may be a coating on the sides.

(B3) In either or both of the chip-scale packaged image sensors denoted as (B1) and (B2), the black mask may extend along the sides from the image sensor to span the full height of the cover glass in direction parallel to the optical axis.

(B4) In any of the chip-scale packaged image sensors denoted as (B1) through (B3), the black mask may extend beyond the full height of the cover glass in direction parallel to the optical axis.

(B5) In any of the chip-scale packaged image sensors denoted as (B1) through (B4), the black mask may extend inwards from the sides along the light-receiving surface of the cover glass to form an aperture for receiving light.

(B6) In any of the chip-scale packaged image sensors denoted as (B1) through (B5), the black mask may extend inwards from the sides along light-receiving surface of the cover glass to form a protruding portion for coupling with pick-and-place equipment.

(B7) In either or both of the chip-scale packaged image sensors denoted as (B1) and (B2), the black mask may extend along the sides from the image sensor only to partial height of the cover glass away from the image sensor.

(B8) In the chip-scale packaged image sensor denoted as (B7), the black mask may extend inwards from the sides along the image sensor to cover all surfaces of the image sensor except (a) the surface bonded with the cover glass and (b) electrical contacts.

(B9) In either or both of the chip-scale packaged image sensors denoted as (B7) and (B8), portions of the sides not covered by the black mask may extend further outwards, away from optical axis of the image sensor, to be flush with the black mask.

Changes may be made in the above systems and methods without departing from the scope hereof. It should thus be noted that the matter contained in the above description and shown in the accompanying drawings should be interpreted as illustrative and not in a limiting sense. The following claims are intended to cover generic and specific features described herein, as well as all statements of the scope of the present systems and methods, which, as a matter of language, might be said to fall therebetween.

What is claimed is:

1. A chip-scale image sensor packaging method with black masking, comprising:
    adhering (a) a composite wafer including a plurality of image sensors bonded to a common glass substrate directly to (b) an adhesive tape to stabilize relative positions of the image sensors until a subsequent step of dicing, wherein the common glass substrate faces away from the adhesive tape;
    cutting through full height of the composite wafer in dimension parallel to the optical axis to form slots in the common glass substrate, the slots defining a cover glass for each of the image sensors, respectively;
    forming black mask in the slots such that the black mask, for each of the image sensors, spans perimeter of the cover glass as viewed cross-sectionally along optical axis of the image sensors, said forming including (a) depositing black photo resist on the composite wafer, and (b) photolithographically developing the black photo resist such that the black mask, for each of the chip-scale packaged image sensors, includes a protruding portion extending beyond light receiving surface of the cover glass in dimension parallel to the optical axis;
    dicing through the black mask in the slots to singulate a plurality of chip-scale packaged image sensors each including one of the image sensors and the cover glass bonded thereto, with sides of the cover glass facing away from the optical axis being at least partly covered by the black mask; and
    after the step of dicing, removing the chip-scale packaged image sensors from the adhesive tape using, for each of the chip-scale packaged image sensors, pick-and-place equipment coupled to the protruding portion.

2. The chip-scale image sensor packaging method of claim 1, further comprising:
    in the step of depositing, depositing black photo resist on surfaces of the image sensors facing away from the common glass substrate;
    in the step of photolithographically developing, photolithographically developing the black photo resist to form the black mask with openings in the black mask matching intended positions of solder-bump electrical contacts of the image sensors.

3. The chip-scale image sensor packaging method of claim 2, further comprising:
    making the solder-bump electrical contacts of the image sensors using the black mask as a solder mask.

4. The chip-scale image sensor packaging method of claim 1, the adhesive tape being opaque.

5. The chip-scale image sensor packaging method of claim 1, the step of forming comprising forming the black mask such that the black mask, for each of the chip-scale packaged image sensors, extends at least along full height of the sides in dimension parallel to the optical axis.

6. A chip-scale packaged image sensor, comprising:
    an image sensor;
    a cover glass bonded to the image sensor;
    a black mask on sides of the cover glass facing away from optical axis of the image sensor, the black mask extending (a) along the sides from the image sensor to span full height of the cover glass in direction parallel to the optical axis, and (b) inwards from the sides along light-receiving surface of the cover glass to form a protruding portion for coupling with pick-and-place equipment.

7. The chip-scale packaged image sensor of claim 6, the black mask extending inwards from the sides along the image sensor to cover all surfaces of the image sensor except (a) surface bonded with the cover glass and (b) electrical contacts.

8. The chip-scale packaged image sensor of claim 7, portions of the sides not covered by the black mask extending further outwards, away from optical axis of the image sensor, to be flush with the black mask.

9. The chip-scale packaged image sensor of claim 6, the cover glass being bonded to the image sensor via an opaque bonding layer.

10. The chip-scale packaged image sensor of claim 6, the black mask being a coating on the sides.

11. The chip-scale packaged image sensor of claim 6, the black mask forming an aperture for receiving light.

\* \* \* \* \*